(12) United States Patent
Faul et al.

(10) Patent No.: US 9,023,715 B2
(45) Date of Patent: May 5, 2015

(54) METHODS OF FORMING BULK FINFET DEVICES SO AS TO REDUCE PUNCH THROUGH LEAKAGE CURRENTS

(75) Inventors: Juergen Faul, Radebeul (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 57 days.

(21) Appl. No.: 13/454,520

(22) Filed: Apr. 24, 2012

(65) Prior Publication Data
US 2013/0280883 A1 Oct. 24, 2013

(51) Int. Cl.
*H01L 21/225* (2006.01)
*H01L 29/66* (2006.01)

(52) U.S. Cl.
CPC ...... *H01L 21/2255* (2013.01); *H01L 29/66803* (2013.01)

(58) Field of Classification Search
CPC ............ H01L 21/2255; H01L 29/66803
USPC .......................... 438/242, 561, 434
See application file for complete search history.

(56) References Cited

U.S. PATENT DOCUMENTS

| | | | | |
|---|---|---|---|---|
| 5,618,751 A | * | 4/1997 | Golden et al. | 438/392 |
| 5,792,708 A | * | 8/1998 | Zhou et al. | 438/647 |
| 5,986,304 A | | 11/1999 | Hshieh et al. | |
| 6,001,684 A | * | 12/1999 | Shen | 438/246 |
| 6,096,598 A | * | 8/2000 | Furukawa et al. | 438/249 |
| 6,281,068 B1 | * | 8/2001 | Coronel et al. | 438/243 |
| 6,534,824 B1 | | 3/2003 | Mandelmann et al. | |
| 6,724,031 B1 | | 4/2004 | Akatsu et al. | |
| 6,734,056 B2 | | 5/2004 | Mandelmann et al. | |
| 7,041,553 B2 | * | 5/2006 | Kangguo et al. | 438/243 |
| 7,223,653 B2 | * | 5/2007 | Cheng et al. | 438/243 |
| 7,956,419 B2 | | 6/2011 | Francis et al. | |
| 2002/0119621 A1 | * | 8/2002 | Lin | 438/242 |
| 2005/0161739 A1 | * | 7/2005 | Anderson et al. | 257/347 |
| 2007/0045748 A1 | | 3/2007 | Booth, Jr. et al. | |
| 2008/0173942 A1 | | 7/2008 | Zhu et al. | |
| 2008/0265308 A1 | | 10/2008 | Lee | |
| 2010/0244103 A1 | * | 9/2010 | Chan et al. | 257/213 |
| 2011/0227162 A1 | | 9/2011 | Lin et al. | |
| 2012/0032732 A1 | | 2/2012 | Xiao et al. | |

OTHER PUBLICATIONS

"Dow Epoxy Novolac Resins: High-temperature High-performance Epoxy Reins". Dow Plastics. Published Oct. 1998.*

* cited by examiner

*Primary Examiner* — Allen Parker
(74) *Attorney, Agent, or Firm* — Amerson Law Firm, PLLC

(57) ABSTRACT

Disclosed are methods of forming bulk FinFET semiconductor devices to reduce punch through leakage currents. One example includes forming a plurality of trenches in a semiconducting substrate to define a plurality of spaced-apart fins, forming a doped layer of insulating material in the trenches, wherein an exposed portion of each of the fins extends above an upper surface of the doped layer of insulating material while a covered portion of each of the fins is positioned below the upper surface of the doped layer of insulating material, and performing a process operation to heat at least the doped layer of insulating material to cause a dopant material in the doped layer to migrate from the doped layer of insulating material into the covered portions of the fins and thereby define a doped region in the covered portions of the fins that is positioned under the exposed portions of the fins.

19 Claims, 7 Drawing Sheets

METHODS OF FORMING BULK FINFET DEVICES SO AS TO REDUCE PUNCH THROUGH LEAKAGE CURRENTS

BACKGROUND OF THE INVENTION

1. Field of the Invention

Generally, the present disclosure relates to the manufacture of sophisticated semiconductor devices, and, more specifically, to various methods of forming bulk FinFET semiconductor devices so as to reduce punch through leakage currents.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce so-called short channel effects. Also, in a FinFET, the junction capacitance at the drain region of the device is greatly reduced, which tends to reduce at least some short channel effects.

However, FinFET devices still exhibit some performance-limiting characteristics. One such characteristic that is detrimental to all forms of semiconductor devices, both FinFETs and planar FETs, is off-state leakage currents. Ideally, off-state leakage current is minimized to increase device performance. In the case of a FinFET device, it has been noted that the punch through leakage current densities vary along the vertical length of the fins with the current densities being much greater at the bottom of the fins proximate the local isolation regions of the device. See, e.g., Okano et al., "Process Integration Technology and Device Characteristics of CMOS FinFET on Bulk Silicon Substrate with sub-10 nm Fin Width and 20 nm Gate Length," *IEDM Technical Digest*, pp. 721-724, 2005. Efforts have been made in the past in attempts to reduce such punch through leakage currents in FinFET devices. For example, in some cases, efforts have been made to form so-called punch through stoppers at the base of the fins by implanting ions into the bottom portion of the fins and/or oxidizing the bottom portion of the fins to effectively merge the local isolation regions together. However, as device dimensions continue to shrink, better and more efficient techniques are desired in an effort to eliminate or reduce detrimental leakage currents.

The present disclosure is directed to various methods of forming FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming bulk FinFET semiconductor devices so as to reduce punch through leakage currents. In one example, the method includes forming a plurality of trenches in a semiconducting substrate to thereby define a plurality of spaced-apart fins in a semiconducting substrate, forming a doped layer of insulating material in the trenches, wherein an exposed portion of each of the fins extends above an upper surface of the doped layer of insulating material while a covered portion of each of the fins is positioned below the upper surface of the doped layer of insulating material, and performing at least one process operation to heat at least the doped layer of insulating material to cause a dopant material in the doped layer of insulating material to migrate from the doped layer of insulating material into the covered portions of the fins and thereby define a doped region in the covered portions of the fins that is positioned under the exposed portions of the fins.

Another illustrative method disclosed herein involves forming a plurality of trenches in a semiconducting substrate to thereby define a plurality of spaced-apart fins in a semiconducting substrate, forming a doped liner layer of insulating material in the trenches, performing an etching process to consume a portion of the doped liner layer and thereby define a recessed doped liner layer of insulating material having an upper surface that is positioned at a level that is below a level of an upper surface of each of the fins, wherein an exposed portion of each of the fins extends above the upper surface of the doped liner layer of insulating material while a covered portion of each of the fins is positioned below the upper surface of the doped liner layer of insulating material, and performing at least one process operation to heat at least the doped liner layer of insulating material to cause a dopant material in the doped liner layer of insulating material to migrate from the doped liner layer of insulating material into the covered portions of the fins and thereby define a doped region in the covered portions of the fins that is positioned under the exposed portions of the fins.

The present disclosure is also directed to various novel FinFET devices. In one illustrative example, the device includes a fin comprised of a semiconducting substrate, a doped layer of insulating material positioned on opposite sides of the fin, the doped layer of insulating material comprising a dopant material and having an upper surface, wherein an exposed portion of the fin extends above the upper surface of the doped layer of insulating material while a covered portion of the fin is positioned below the upper surface of the doped layer of insulating material, a doped region comprised of the dopant material in the covered portion of the fin that is positioned under the exposed portion of the fin, a gate insulation layer positioned above the fin and a gate electrode positioned above the gate insulation layer.

BRIEF DESCRIPTION OF THE DRAWINGS

The disclosure may be understood by reference to the following description taken in conjunction with the accompanying drawings, in which like reference numerals identify like elements, and in which.

Figure 1A:
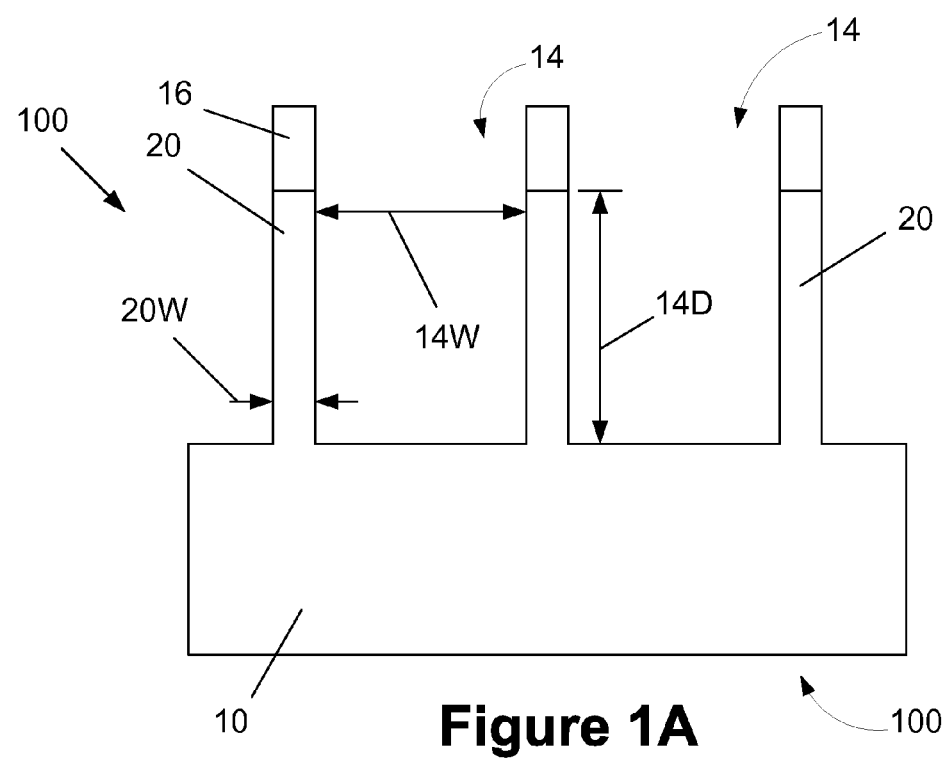
FIGS. 1A-1G depict one illustrative method disclosed herein of forming bulk FinFET semiconductor devices so as to reduce punch through leakage currents.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming bulk FinFET semiconductor devices so as to reduce punch through leakage currents and to various novel FinFET devices. As will be readily apparent to those skilled in the art upon a complete reading of the present application, the various methods disclosed herein may be employed in manufacturing a variety of devices, including, but not limited to, logic devices, memory devices, etc. With reference to the attached figures, various illustrative embodiments of the methods and devices disclosed herein will now be described in more detail.

In general, the formation of a FinFET device involves the formation of one or more fins in a semiconducting substrate. As will be understood by those skilled in the art after a complete reading of the present application, the fins for the devices disclosed herein may be manufactured using any desired technique. For example, the fins may be formed prior to filling various trenches that will eventually become isolation structures for the FinFET device with an insulating material. The fins may also be formed using a so-called damascene-like technique. In the damascene-like technique, a plurality of trenches are formed in the substrate that defines the fins and the isolation trenches, all of the trenches are filled with an insulating material, an etch mask is formed to cover the isolation regions while exposing the region where the fins will be formed, and an etch process is performed that is non-selective relative to the substrate and the insulating material. The non-selective etch process is performed for a sufficient duration such that a portion of the thickness of the layer of insulating material in the fin region is removed which thereby exposes the fins to the desired height. Thus, the present invention should not be considered as limited to any particular technique for manufacturing the fins of a FinFET device.

FIGS. 1A-1G depict one illustrative technique for forming a novel FinFET device 100. The FinFET device 100 is formed in and above a semiconducting substrate 10. The substrate 10 may have a variety of configurations, such as the depicted bulk silicon configuration. The substrate 10 may be made of silicon or it may be made of materials other than silicon.

At the point of fabrication depicted in FIG. 1A, a patterned mask layer 16, such as a patterned hard mask layer, has been formed above the substrate 10 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a furnace oxidation process, a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a stack of hard mask layers of silicon dioxide and silicon nitride that is initially formed by performing a thermal oxidation process and a CVD process and thereafter patterned using known sidewall image transfer techniques and/or photolithographic techniques combined with performing known etching techniques.

With continuing reference to FIG. 1A, an etching process, such as a dry or wet etching process, is then performed on the substrate 10 through the patterned mask layer 16 to form a plurality of trenches 14. This etching process results in the definition of a plurality of fins 20. In some applications, a further etching process may be performed to reduce the width or to "thin" the fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

The overall size, shape and configuration of the trenches 14 and fins 20 may vary depending on the particular application. The depth 14D and width 14W of the trenches 14 may vary depending upon the particular application. In one illustrative embodiment, based on current technology, the depth 14D of the trenches 14 may range from approximately 30-250 nm and the width 14W of the trenches 14 may range from about 30-250 nm. In some embodiments, the fins 20 may have a width 20W within the range of about 10-20 nm. In the illustrative example depicted herein, the trenches 14 and fins 20 are all of a substantially uniform size and shape. However, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 1B:
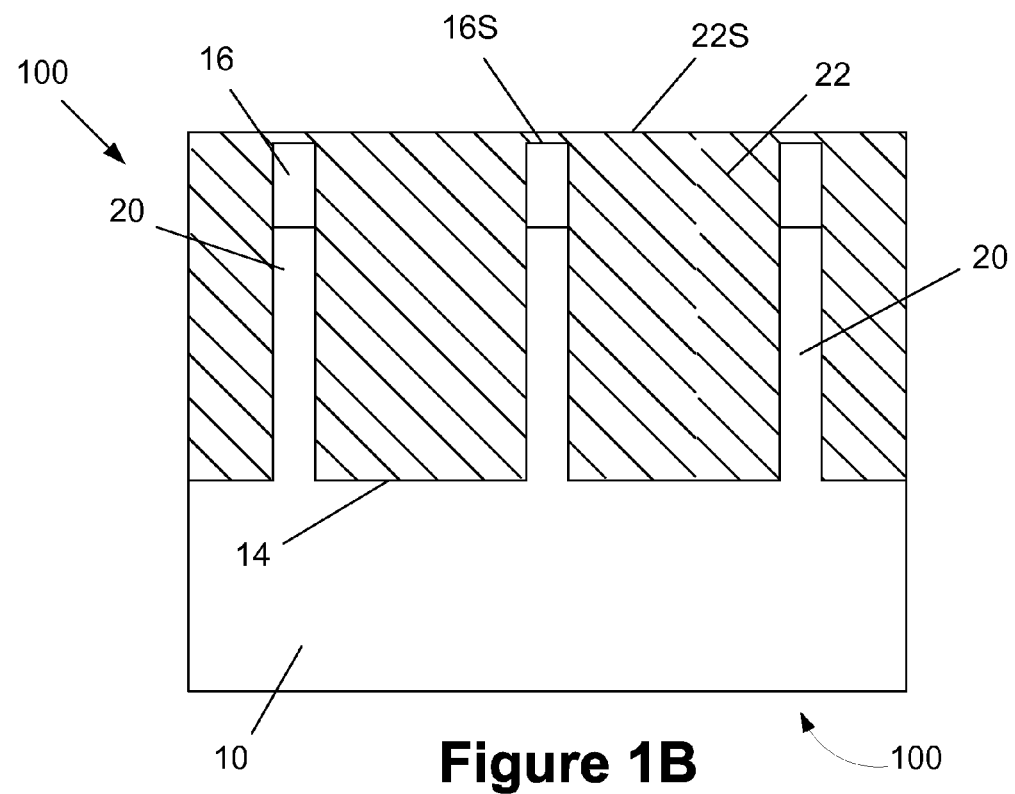

Then, as shown in FIG. 1B, a doped layer of insulating material 22 is formed in the trenches 14 of the device 100. The doped layer of insulating material 22 may be doped with an N-type dopant material for P-type FinFET devices or with a P-type dopant material for N-type FinFET devices. The doped layer of insulating material 22 may be comprised of a variety of different materials depending upon the particular application, such as boron silicate glass (BSG), phosphorus silicate glass (PSG), boron phosphorus silicate glass (BPSG), etc., and it may be formed by performing a variety of techniques, e.g., CVD, ALD, spin-coating, etc. In one illustrative embodiment, the doped layer of insulating material 22 may be formed by introducing the dopant using an in situ doping technique, i.e., the dopant may be introduced into the layer of insulating material as it is being formed. In another example, the layer of insulating material may be initially formed in an undoped condition and thereafter the dopant material may be introduced into the layer of insulating material by performing an ion implantation process. The amount of dopant material in the doped layer of insulating material 22 may vary depending upon the particular application. In one illustrative embodiment, the doped layer of insulating material 22 may have a dopant concentration of about $10^{22}$-$10^{23}$ ion/cm$^3$. In the case where the dopant materials are introduced by way of ion implantation, the dopant dose may be about $10^{15}$ ions/cm$^2$ and the implant energy may be about 5-30 keV.

In the example depicted in FIG. 1B, the surface 22S of the doped layer of insulating material 22 is the "as-deposited" surface of the layer 22. In this example, the surface 22S of the doped layer of insulating material 22 may be positioned slightly above the upper surface 16S of the mask layer 16. Alternatively, if desired, a chemical mechanical polishing (CMP) process may be performed to planarize the surface 22S using the mask layer 16 as a polish-stop layer. After such a CMP process, the surface 22S of the doped layer of insulating material 22 would be substantially level with the surface 16S of the mask layer 16.

Figure 1C:
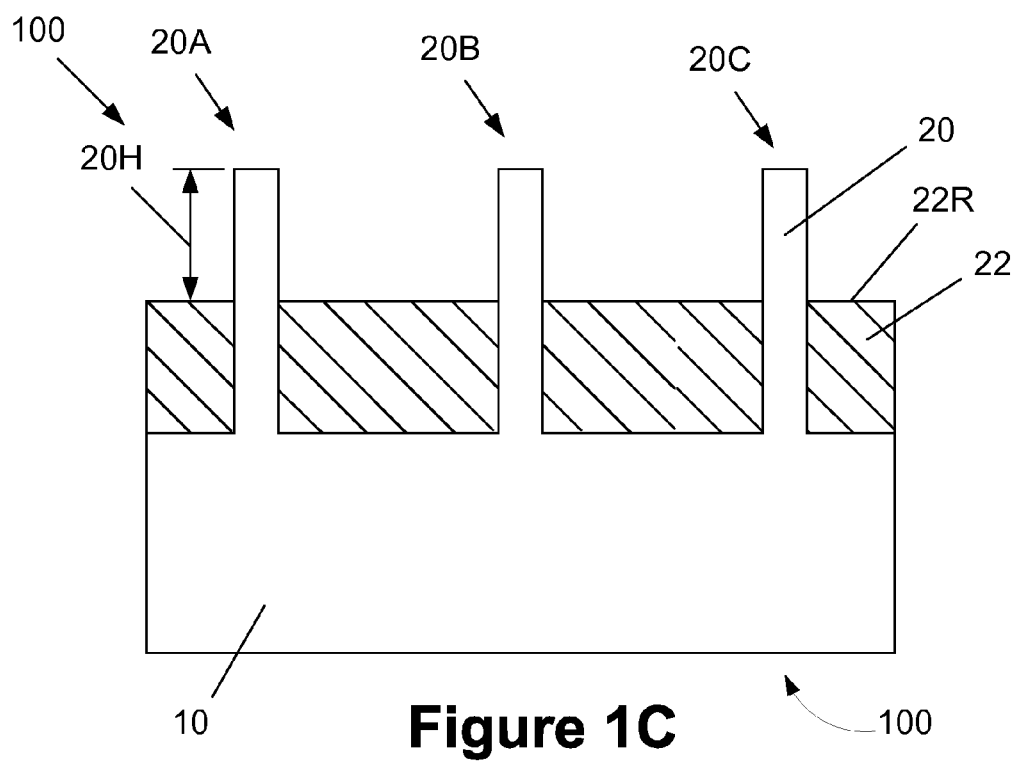

FIG. 1C depicts the device 100 after an etching process has been performed to recess the doped layer of insulating material 22 and the patterned hard mask 16 has been removed. The recessed layer of insulating material has a recessed surface 22R. The doped layer of insulating material 22 covers a lower portion of the fins 20 while exposing an upper portion of the fins 20. In the illustrative example depicted herein, the device 100 is comprised of three illustrative fins: 20A, 20B and 20C. Of course, the present invention may be used with any FinFET device having one or more fins. In one example, starting with the device depicted in FIG. 1B, the doped layer of insulating material 22 may be recessed by simply performing an etching process on the as-deposited surface 22S of the doped layer of insulating material 22. Alternatively, a CMP process may be performed on the doped layer of insulating material 22 prior to performing such an etching process if desired. The recessed doped layer of insulating material 22 essentially defines the final fin height 20H of the fins 20. The fin height 20H may vary depending upon the particular application and, in one illustrative embodiment, may range from about 20-50 nm. Note that if the dopant material is introduced into the layer of insulating material 22 by performing one or more ion implant processes, the implant process(es) may be performed before or after the layer of insulating material is recessed.

Figure 1D:
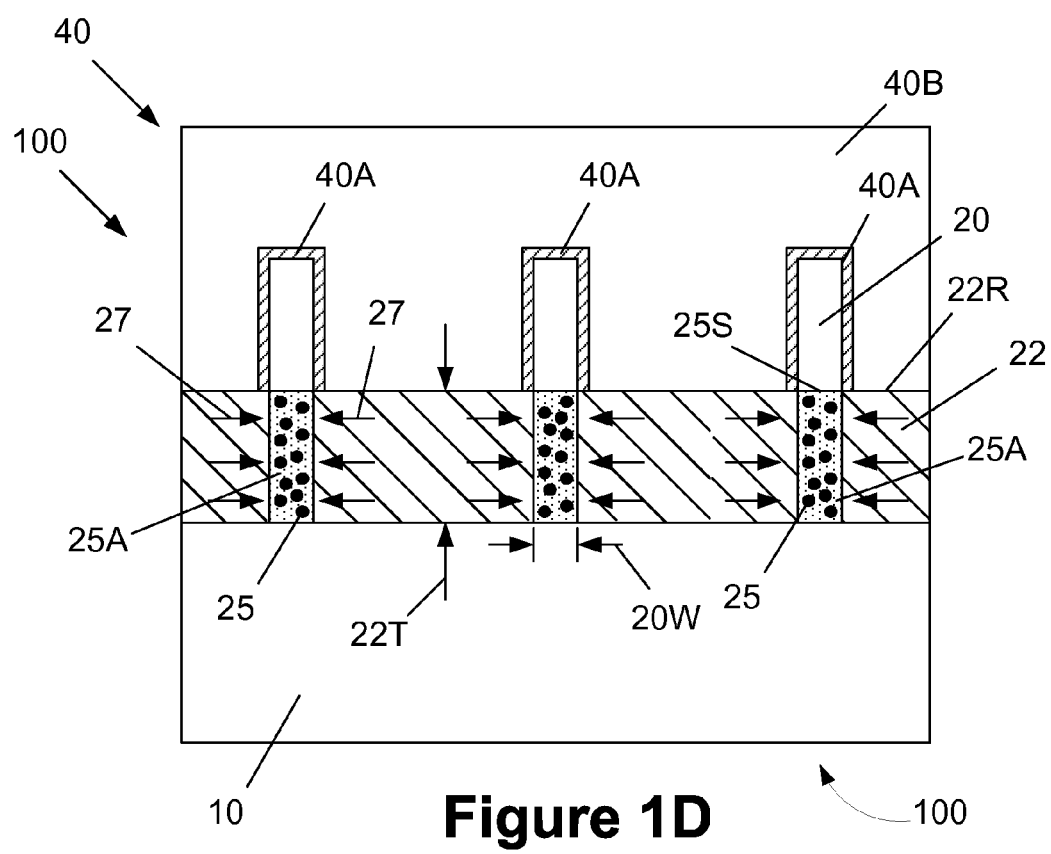

At the point of processing depicted in FIG. 1C, the illustrative FinFET device 100 may be completed using traditional fabrication techniques. For example, FIG. 1D depicts the device 100 after an illustrative gate structure 40 has been formed for the device 100. In one illustrative embodiment, the schematically depicted gate structure 40 includes an illustrative gate insulation layer 40A and an illustrative gate electrode 40B. The gate insulation layer 40A may be comprised of a variety of different materials, such as, for example, silicon dioxide, a so-called high-k (k greater than 5) insulation material (where k is the relative dielectric constant), etc. Similarly, the gate electrode 40B may also be of a material such as polysilicon or amorphous silicon, or it may be comprised of one or more metal layers that act as the gate electrode 40B. As will be recognized by those skilled in the art after a complete reading of the present application, the gate structure 40 of the device 100 depicted in the drawings, i.e., the gate insulation layer 40A and the gate electrode 40B, is intended to be representative in nature. That is, the gate structure 40 may be comprised of a variety of different materials and it may have a variety of configurations, and the gate structure 40 may be made using either the so-called "gate-first" or "replacement gate" techniques. In one illustrative embodiment, as shown in FIG. 1D, an oxidation process may be performed to form a gate insulation layer 40A comprised of silicon dioxide on the fins 20. Thereafter, the gate electrode material 40B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure 40 by blanket-depositing a layer of spacer material and thereafter performing an anisotropic etching process to define the spacers.

As schematically depicted in FIG. 1D, after the doped layer of insulating material 22 is formed and recessed, various process operations that are performed to complete the manufacture of the device 100 will cause the dopant material 25 in the doped layer of insulating material 22 to migrate into the fins 20, as reflected by the arrows 27, thereby creating a doped punch-through stopper region 25A within the covered portions of the fins 20. The heating of the device that causes the dopant migration may occur during, for example, at least one of the various process operations (e.g., deposition, etching, etc.) that will be performed to form the gate structure 40, form sidewall spacers for the device, and/or form epitaxial material for the source/drain regions of the device, etc. The heating of the device during these various process operations may be cumulative in nature as it relates to causing the migration of the dopant material from the doped layer of insulating material 22 into the doped region 25A. If desired, a dedicated and separate heating step may be performed on the device 100 to cause the dopant material 25 to migrate, e.g., a heating process at a temperature within the range of 700-1100° C. for a duration of a few seconds to 1-2 hours depending upon the type of heating equipment employed (e.g., RTA equipment or a furnace). Note that the upper surface 25S of the doped region 25A is approximately aligned with the recessed surface 22R of the doped layer of insulating material 22. In one illustrative embodiment, the doped region 25A extends across the entire width 20W of the covered portion of the fins 20, and the doped region 25A has a height that corresponds approximately to the thickness 22T of the doped layer of insulating material 22. After the dopant material 25 has migrated, the doped region 25A may have a dopant concentration of about $10^{19}$-$10^{21}$ ion/cm$^3$.

Figure 1E:
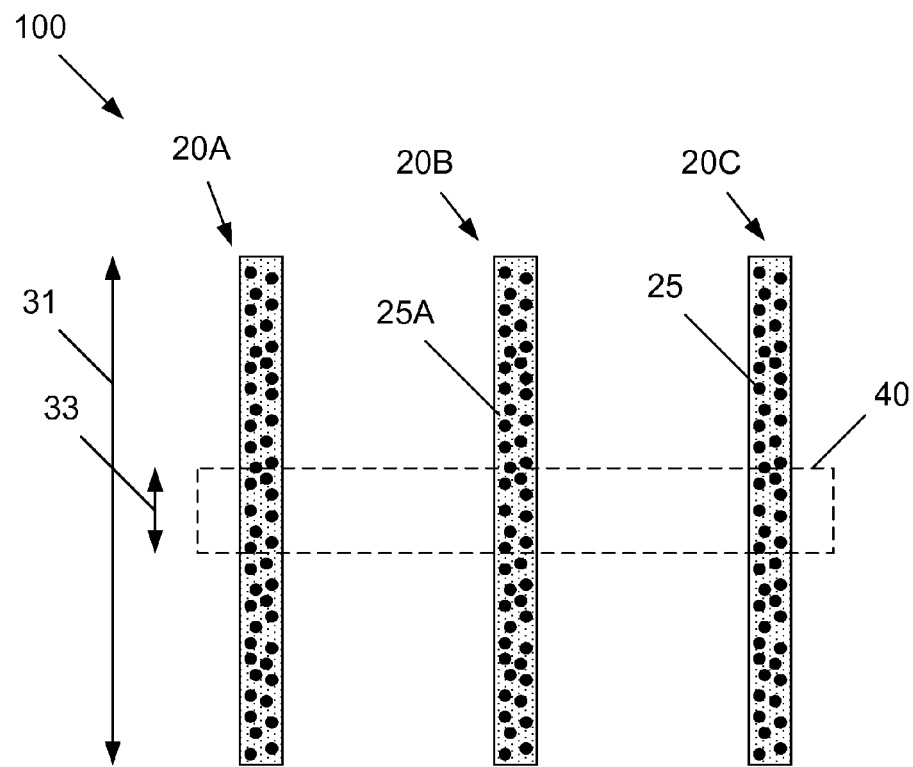
Figure 1F:
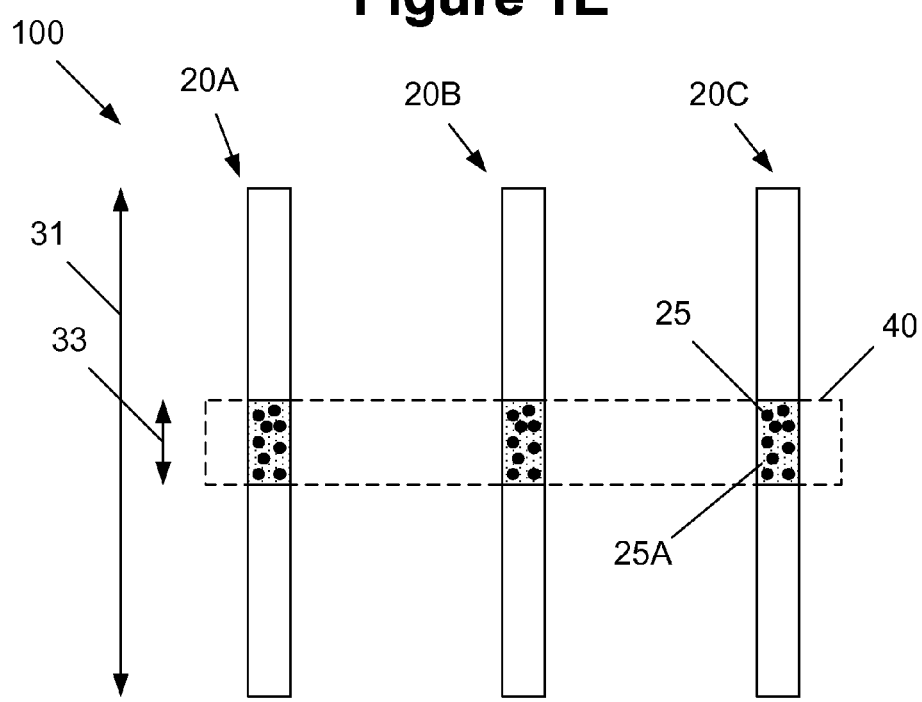

FIGS. 1E-1F are simplified schematic plan views of the device 100 showing the fins 20 and the gate structure 40 (in dashed lines). As shown in FIG. 1E, in one illustrative example, e.g., where the layer of insulating material 22 is doped using an in situ doping technique, the doped region 25A may extend for the entire axial length 31 of the fins 20. In the case where the dopants are introduced into the layer of insulating material 22 by performing an ion implantation process, the doped regions 25A may be formed only in the layer of insulating materials 22 located in the gate region 33 of the fins 20 that will be covered by the gate structure 40 when it is formed, as shown in FIG. 1F. Selectively positioning the doped regions 25A only in the portions of the layer of insulating material 22 that are positioned proximate the gate region 33 of the fins 20 may be accomplished by performing the ion implantation process through a patterned implant mask, e.g., a patterned photoresist mask (not shown) that exposes the portions of the layer of insulating material 22 that are positioned adjacent the gate region 33 of the fins 20. Of course, if desired, doped regions 25A that extend along the entire axial length 31 of the fins 20, as shown in FIG. 1E, may also be formed by performing one or more ion implantation processes.

Figure 1G:
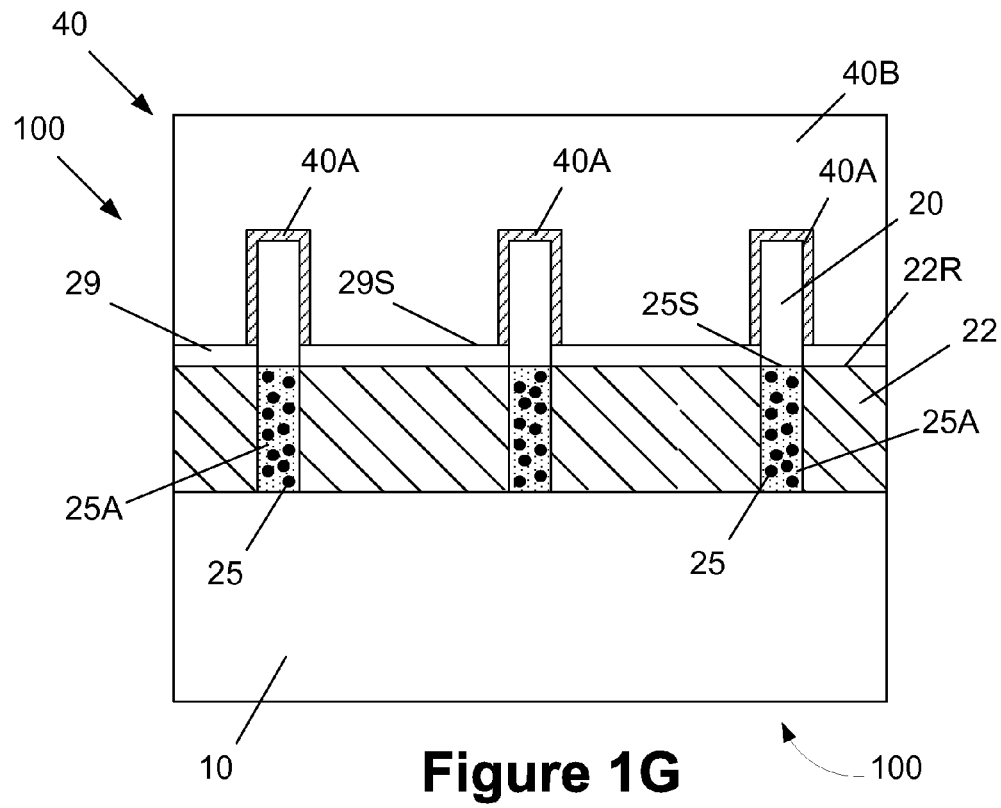

FIG. 1G depicts another illustrative embodiment of the device 100 disclosed herein. In this illustrative example, a layer of insulating material 29 is positioned between the gate electrode 40B and the doped layer of insulating material 22. In effect, the layer of insulating material 29 acts as a spacer material that acts to prevent or limit migration of the dopant material 25 from the doped insulating layer 22 into the gate electrode 40B. The layer of insulating material 29 may be comprised of a variety of different materials, e.g., silicon dioxide, silicon nitride, etc., its thickness may vary depending upon the particular application (e.g., 1-20 nm), and it may be formed using a variety of techniques and processes. The layer of insulating material 29 may be made of the same material as that of the doped layer of insulating material 22, or it may be made of a different material than that of the doped layer of insulating material 22. In one illustrative embodiment, the layer of insulating material 29 may be an undoped layer of material, or it may have a much lower dopant concentration than that of the doped layer of insulating material 22, e.g., a dopant concentration of 1 $e^{11}$-1$e^{17}$ ion/cm$^3$. In one example, after the doped layer of insulating material 22 is recessed (as shown in FIG. 1C), the layer of insulating material 29 may be formed by performing a similar process sequence, i.e., deposition, CMP, etch back, until the layer 29 is at its final desired thickness. In this embodiment, the upper surface 29S of the layer of insulating material 29 defines the final fin height.

Figure 2A:
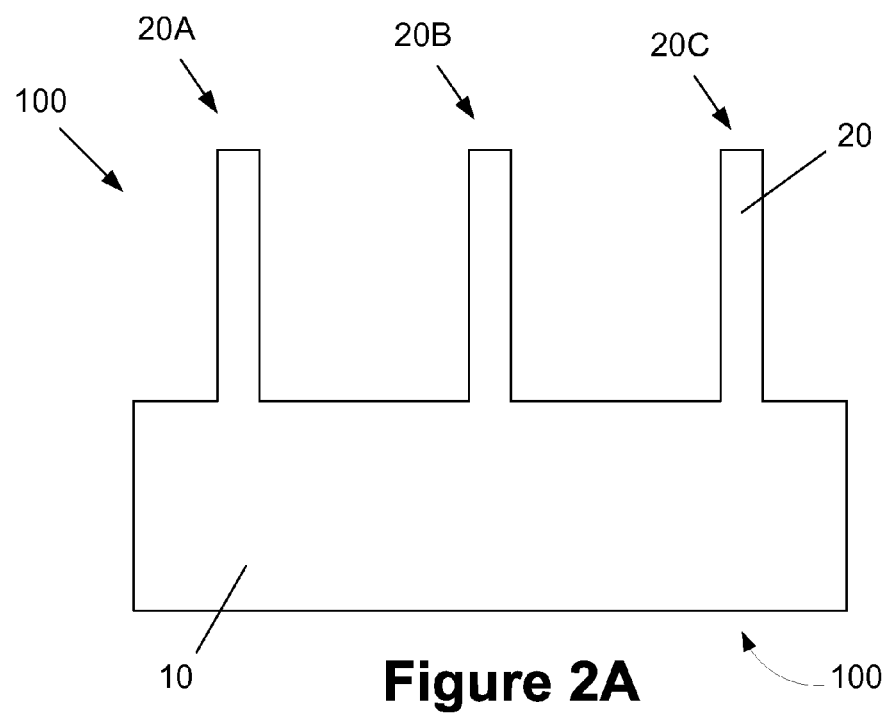
FIGS. 2A-2F depict yet another illustrative method disclosed herein of forming bulk FinFET semiconductor devices so as to reduce punch through leakage currents.
Figure 2B:
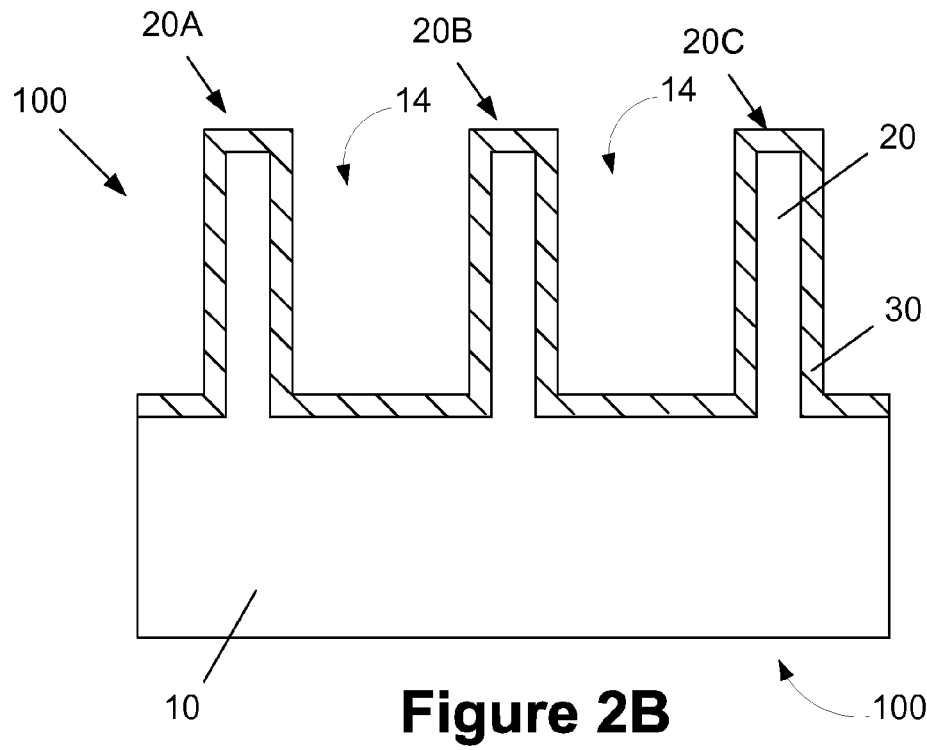

FIGS. 2A-2F depict another illustrative method disclosed herein. FIG. 2A depicts the device 100 at a point in fabrication wherein the fins 20 have been formed for the device 100. Then, as shown in FIG. 2B, a doped liner layer 30 is formed in the trenches 14 and on the fins 20. The doped liner layer 30 may be doped with an N-type dopant material for P-type FinFET devices or with a P-type dopant for N-type FinFET devices. The doped liner layer 30 may be comprised of a variety of different insulating materials depending upon the particular application, such as boron silicate glass (BSG), phosphorus silicate glass (PSG), boron phosphorus silicate glass (BPSG), etc. The doped liner layer 30 may be formed by performing a conformal deposition process, e.g., a conformal CVD or ALD process, and its thickness may vary depending upon the particular application, e.g., 1-20 nm. In one illustrative embodiment, the doped liner layer 30 may be formed by introducing the dopant material using an in situ doping technique, i.e., the dopant may be introduced into the liner layer material as the doped liner layer 30 is being formed. In another example, the liner layer may be initially formed in an undoped condition, and thereafter the dopant material may be introduced into the liner layer material by performing an ion implantation process. The amount of dopant material in the doped liner layer 30 may vary depending upon the particular application. In one illustrative embodiment, the doped liner layer 30 may have a dopant concentration that is the same as that described above for the doped layer of insulating material 22.

Figure 2C:
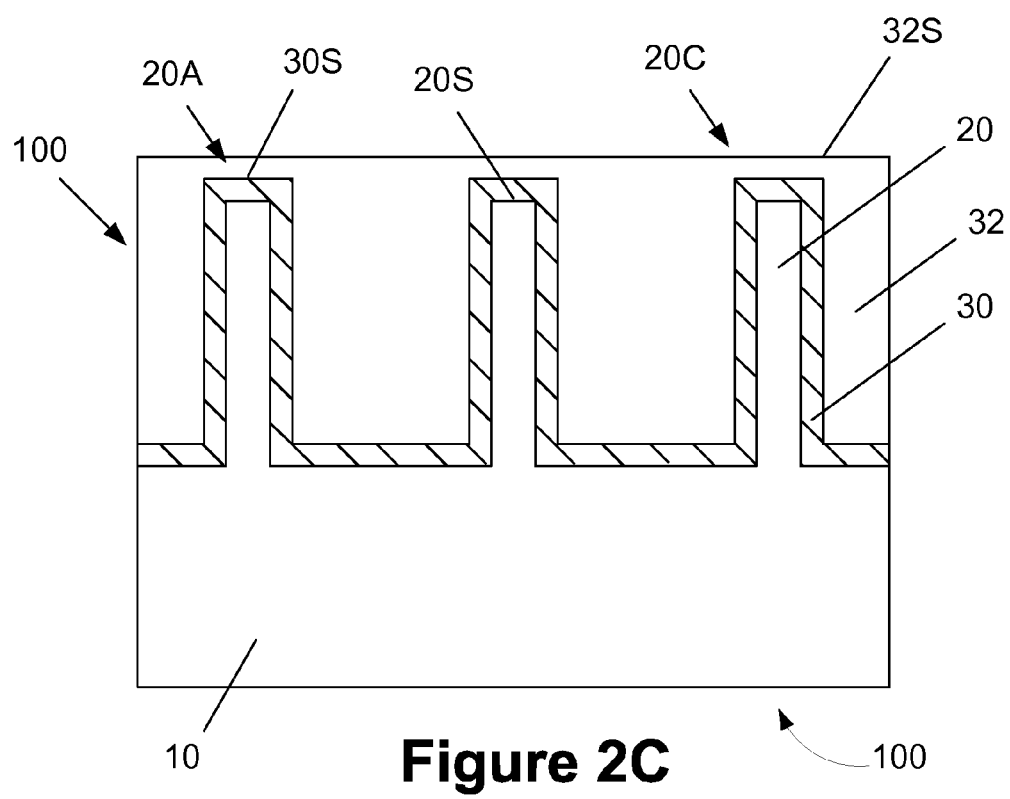

Then, as shown in FIG. 2C, an undoped layer of insulating material 32 is formed in the trenches 14 of the device 100 on the doped liner layer 30. The undoped layer of insulating material 32 may be comprised of a variety of different materials depending upon the particular application, such as silicon dioxide, spin-on-glass (SOG), etc., and it may be formed by performing a variety of techniques, e.g., CVD, ALD, etc. In one illustrative embodiment, the surface 32S of the undoped layer of insulating material 32 is the "as-deposited" surface of the undoped layer of insulating material 32. In this example, the surface 32S of the undoped layer of insulating material 32 may be positioned slightly above the upper surface 30S of the doped liner layer 30. Alternatively, if desired, a chemical mechanical polishing (CMP) process may be performed to planarize the surface 30S using the fins 20 as a polish-stop. After such a CMP process, the surface 30S of the doped liner layer 30 would be substantially level with the surface 20S of the fins 20.

Figure 2D:
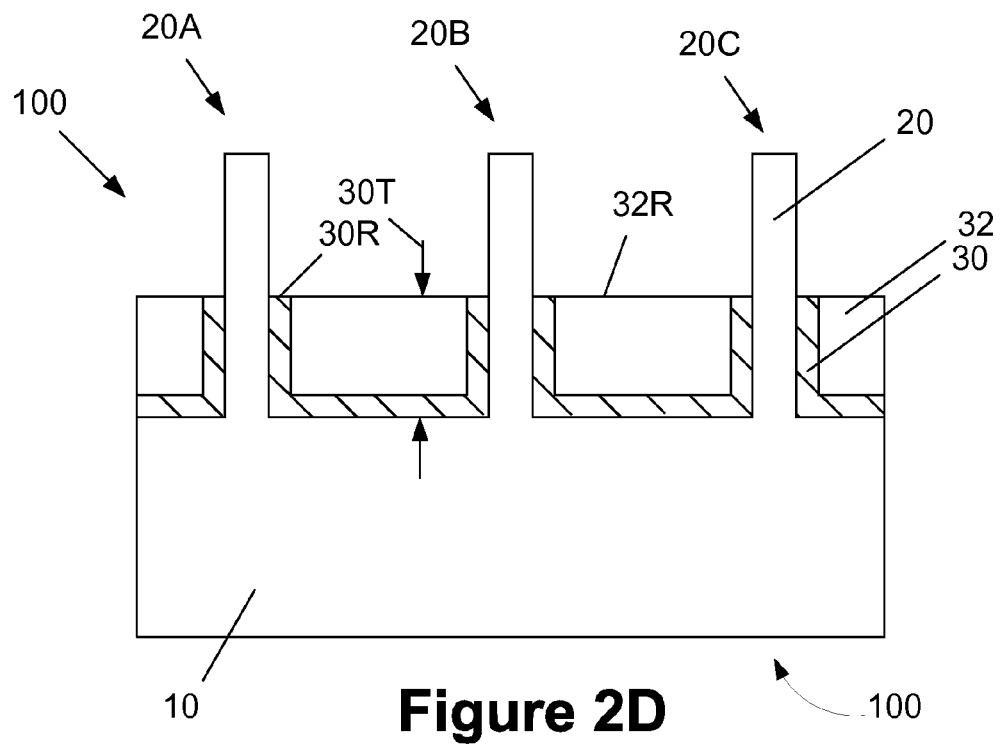

FIG. 2D depicts the device 100 after one or more etching process(es) has been performed to recess the doped liner layer 30 and the undoped layer of insulating material 32. The recessed undoped layer of insulating material 32 has a recessed surface 32R while the doped liner layer 30 has a recessed surface 30R. After the recess process is performed, the portion of the doped liner layer 30 positioned adjacent the fins 20 has an overall height 30T. The doped liner layer 32 covers a lower portion of the fins 20 while exposing an upper portion of the fins 20. The combination of the recessed doped liner layer 30 and the recessed undoped layer of insulating material 32 essentially defines the final fin height of the fins 20.

Figure 2E:
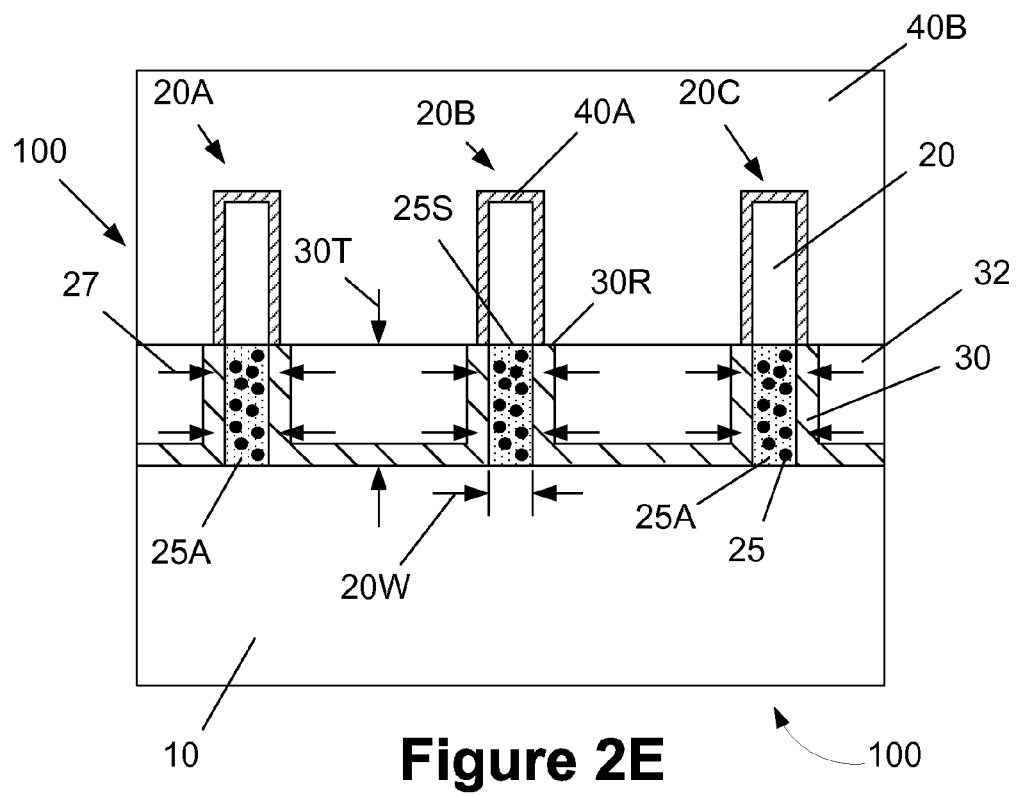

At the point of processing depicted in FIG. 2D, the illustrative FinFET device 100 may be completed using traditional fabrication techniques. For example, FIG. 2E depicts the device 100 after a previously described gate structure 40 has been formed for the device 100. In one illustrative embodiment, the schematically depicted gate structure 40 includes an illustrative gate insulation layer 40A and an illustrative gate electrode 40B. As schematically depicted in FIG. 2E and as described above with respect to the migration of dopant material 25 from the doped layer of insulating material 22, after the doped liner layer 30 is formed and recessed, various process operations that are performed to manufacture the device 100 will cause the dopant material 25 in the doped liner layer 30 to migrate into the covered portions of the fins 20, as reflected by the arrows 27, thereby creating a doped punch-through stopper region 25A within the covered portions of the fins 20. Note that the upper surface 25S of the doped regions 25A is approximately aligned with the recessed surface 30R of the doped liner layer 30. Alternatively, as described previously, a separate heating step may be performed on the device 100 to cause the migration of the dopant material 25 and the formation of the doped regions 25A. In one illustrative embodiment, the doped region 25A extends across the entire width 20W of the covered portion of the fins 20, and the doped region 25A has a height that corresponds approximately to the height 30T of the portion of the doped liner layer 30 that is positioned against the covered portions of the fins 20. After the dopant material 25 has migrated, using this technique, the doped region 25A may have a dopant concentration of about $10^{19}$-$10^{21}$ ion/cm$^3$.

As in the previously described example, where the doped liner layer 30 is doped using an in situ doping technique, the doped regions 25A may extend for the entire axial length 31 of the fins 20 (see FIG. 1E). In the case where the dopants are introduced into the doped liner layer 30 by performing an ion implantation process, the doped regions 25A may be formed only in the gate region 33 of the fins 20 that will be covered by the gate structure 40 when it is formed (see FIG. 1F). As with the previous example, selectively positioning the doped regions 25A only in the gate region 33 of the fins 20 may be accomplished by performing the ion implantation process on only selected portions of the liner layer 30 through a patterned implant mask, e.g., a patterned photoresist mask (not shown) that exposes the liner layer in the gate region 33 of the fins 20. Of course, if desired, doped regions 25A that extend along the entire axial length 31 of the fins 20, as shown in FIG. 1E, may also be formed by performing one or more ion implantation processes on the entire liner layer 30.

Figure 2F:
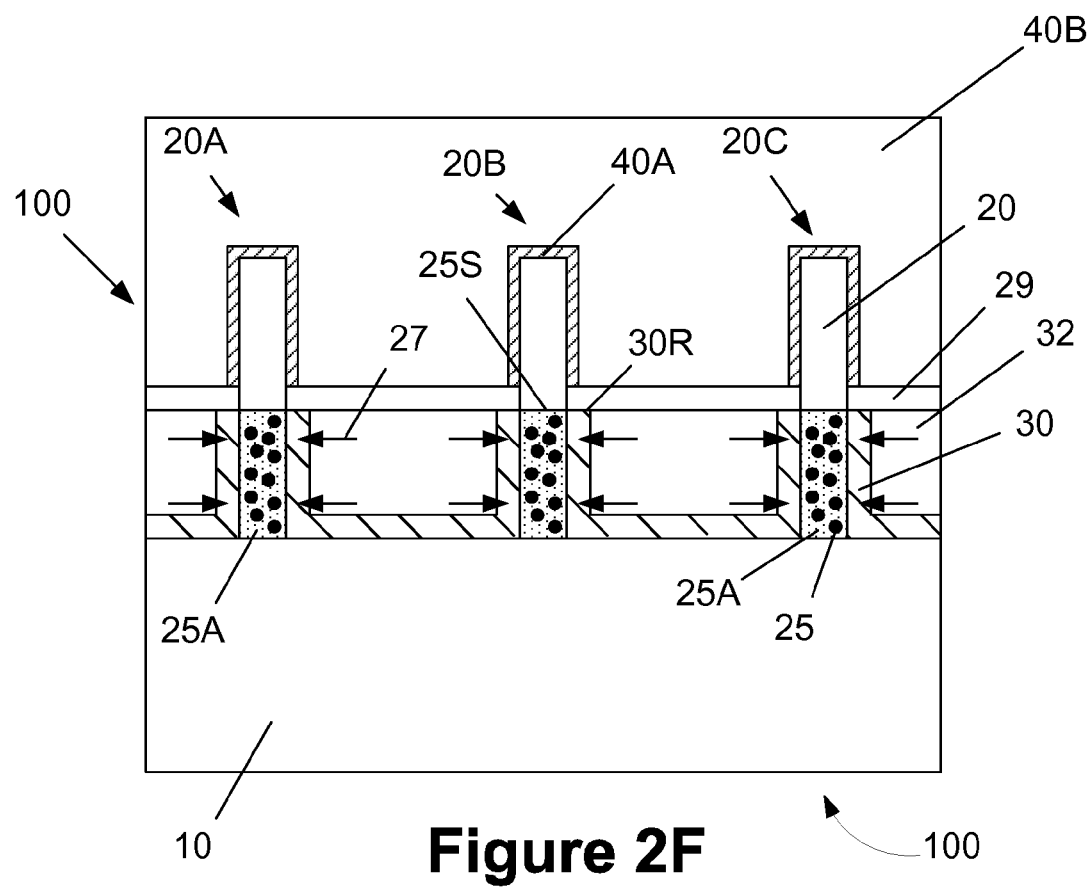

FIG. 2F depicts an embodiment of the device 100 wherein the previously described layer of insulating material 29 is positioned between the gate electrode 40B and the doped liner layer 30. In effect, the layer of insulating material 29 acts as a spacer material that acts to prevent or limit migration of the dopant material 25 from the doped liner layer 30 into the gate electrode 40B. The layer of insulating material 29 may be made of the same material as that of the doped liner layer 30 or the undoped layer of insulating material 32, or it may be made of a different material than that of the doped liner layer 30 or the undoped layer of insulating material 32. The layer 29 may be formed as previously described.

In another illustrative aspect of the subject matter disclosed herein, the doped layer of insulating material 22, the doped liner layer 30 and/or the undoped layer of insulating material 32 may be provided with a desired stress profile to enhance the performance of the FinFET device. For example, in the case of an N-type FinFET, one or more of these layers of material may have a tensile stress to thereby enhance the mobility of electrons for the N-type FinFET device. In the case of a P-type FinFET, one or more of these layers of material may have a compressive stress to thereby enhance the mobility of holes for the P-type FinFET device. The manner in which materials are formed so as to exhibit the desired stress levels are well known to those skilled in the art.

As will be appreciated by one skilled in the art after a complete reading of the present application, the methods disclosed herein may be readily employed to fabricate CMOS based devices. In general, using known masking techniques, one type of device, e.g., the N-type FinFETs, may be exposed while the P-type FinFETs are masked, and the techniques disclosed herein may be performed on the exposed N-type FinFETs. Thereafter, the mask may be removed, and another mask may be formed that covers the N-type FinFETs and exposes the P-type FinFETs for further processing. The techniques disclosed herein may then be performed on the exposed P-type FinFETs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device comprised of a gate structure, the method comprising:
    forming a plurality of trenches in a semiconducting substrate to thereby define a plurality of spaced-apart fins in a semiconducting substrate, each of said trenches having a bottom surface;
    forming a doped liner layer of insulating material on said fins and on the entire bottom surface of said trenches;
    forming an undoped layer of insulating material above said doped liner layer such that said undoped layer of insulating material overfills said trenches and is positioned between said fins, wherein said undoped layer of insulating material has an upper surface that is positioned at a level that is above a level of an upper surface of said fins and above an upper surface of said doped liner layer;

performing at least one recess etching process to consume a portion of said doped liner layer and a portion of said undoped layer of insulating material to thereby define a recessed doped liner layer of insulating material and a recessed undoped layer of insulating material said recessed doped liner layer covering the entire bottom surface of said trenches and having a recessed upper surface that is positioned at a level that is below a level of the upper surface of each of said fins, wherein an exposed portion of each of said fins extends above said recessed upper surface of said recessed doped liner layer of insulating material while a covered portion of each of said fins is positioned below said recessed upper surface of said recessed doped liner layer of insulating material;

forming said gate structure comprised of a gate insulation layer and a gate electrode around said exposed portions of each of said fins and above said recessed doped liner layer of insulating material positioned on the entire bottom surface of said trenches and said recessed undoped layer of insulating material; and at some point after forming said recessed doped liner layer of insulating material, performing at least one process operation to heat at least said recessed doped liner layer of insulating material to cause a dopant material in said recessed doped liner layer of insulating material to migrate from said recessed doped liner layer of insulating material into said covered portions of said fins and thereby define a doped region in said covered portions of said fins that is positioned under said exposed portions of said fins.

2. The method of claim 1, wherein forming said doped liner layer of insulating material comprises introducing said dopant material into said doped liner layer of insulating material by performing an in situ doping process whereby said dopant material is introduced into said doped liner layer of insulating material as it is being formed.

3. The method of claim 1, wherein forming said doped liner layer of insulating material comprises:
depositing an undoped liner layer of insulating material; and
performing at least one ion implantation process to introduce said dopant material into said undoped liner layer of insulating material.

4. The method of claim 1, wherein said FinFET device is an N-type FinFET device and wherein said doped liner layer of insulating material is doped with a P-type dopant.

5. The method of claim 4, wherein said doped liner layer of insulating material is boron silicate glass (BSG).

6. The method of claim 1, wherein said FinFET device is a P-type FinFET device and wherein said doped liner layer of insulating material is doped with an N-type dopant.

7. The method of claim 6, wherein said doped liner layer of insulating material is phosphorus silicate glass (PSG).

8. The method of claim 1, wherein said doped liner layer of insulating material has a dopant concentration of about $10^{22}$-$10^{23}$ ion/cm$^{-1}$.

9. The method of claim 1, wherein said doped region in said covered portions of said fins has a dopant concentration of about $10^{19}$-$10^{21}$ ion/cm$^3$.

10. The method of claim 1, wherein said doped region in said covered portions of said fins extends along an entire axial length of each of said fins.

11. The method of claim 1, wherein said doped region in said covered portions of said fins is positioned below said gate structure for said device.

12. A method of forming a FinFET device comprised of a gate structure, the method comprising:
forming a plurality of trenches in a semiconducting substrate to thereby define a plurality of spaced-apart fins in a semiconducting substrate, each of said trenches having a bottom surface;

performing an in situ doping deposition process to form a doped liner layer of insulating material on said fins and on the entire bottom surface of said trenches, said doped liner layer of insulating material comprising a dopant material;

depositing an undoped layer of insulating material in said trenches above said doped liner layer of insulating material such that it overfills said trenches and is positioned between said fins, wherein said undoped layer of insulating material has an upper surface that is positioned at a level that is above a level of an upper surface of said fins and above an upper surface of said doped liner layer;

performing at least one recess etching process to consume a portion of said doped liner layer and a portion of said undoped layer of insulating material to thereby define a recessed doped liner layer of insulating material and a recessed undoped layer of insulating material, said recessed doped liner layer of insulating material covering the entire bottom surface of said trenches and having a recessed upper surface that is positioned at a level that is below a level of an upper surface of each of said fins, wherein an exposed portion of each of said fins extends above said recessed upper surface of said doped liner layer of insulating material while a covered portion of each of said fins is positioned below said recessed upper surface of said doped liner layer of insulating material;

forming said gate structure comprised of a gate insulation layer and a gate electrode around said exposed portions of each of said fins and above said recessed doped liner layer of insulating material positioned on the entire bottom surface of said trenches and said recessed undoped layer of insulating material; and at some point after forming said recessed doped liner layer of insulating material, performing at least one process operation to heat at least said recessed doped liner layer of insulating material to cause a dopant material in said recessed doped liner layer of insulating material to migrate from said recessed doped liner layer of insulating material into said covered portions of said fins and thereby define a doped region in said covered portions of said fins that is positioned under said exposed portions of said fins.

13. The method of claim 12, wherein said FinFET device is an N-type FinFET device and wherein said doped liner layer of insulating material is doped with a P-type dopant.

14. The method of claim 13, wherein said doped liner layer of insulating material is boron silicate glass (BSG).

15. The method of claim 12, wherein said FinFET device is a P-type FinFET device and wherein said doped liner layer of insulating material is doped with an N-type dopant.

16. The method of claim 15, wherein said doped liner layer of insulating material is phosphorus silicate glass (PSG).

17. The method of claim 12, wherein said doped liner layer of insulating material has a dopant concentration of about $10^{22}$-$10^{23}$ ion/cm$^3$.

18. The method of claim 12, wherein said doped region in said covered portions of said fins has a dopant concentration of about $10^{19}$-$10^{21}$ ion/cm$^3$.

19. The method of claim 12, wherein said doped region in said covered portions of said fins extends along an entire axial length of each of said fins.

\* \* \* \* \*